FREQUENCY SELECTIVE AMPLIFIER AND OSCILLATOR CIRCUITS EMPLOYING PIEZOELECTRIC ELEMENTS TO CONTROL FREQUENCY

INVENTORS:
A. M. WIGGINS
G. A. HARRIS
BY J. B. Burke
ATTORNEY.

INVENTORS:
A.M. WIGGINS
G.A. HARRIS
BY J. B. Burke
ATTORNEY.

United States Patent Office 3,421,109

Patented Jan. 7, 1969

3,421,109

FREQUENCY SELECTIVE AMPLIFIER AND OSCILLATOR CIRCUITS EMPLOYING PIEZOELECTRIC ELEMENTS TO CONTROL FREQUENCY

Alpha M. Wiggins, San Juan, Puerto Rico, and George Allen Harris, Hialeah, Fla., assignors to Euphonics Corporation, Guaynabo, Puerto Rico, a corporation of Puerto Rico Filed Apr. 19, 1967, Ser. No. 635,947

U.S. Cl. 331—116 8 Claims

Int. Cl. H03b *5/30;* H03b *5/32;* H03f *3/04*

ABSTRACT OF THE DISCLOSURE

The disclosure describes frequency selective amplifier circuits and oscillator circuits, in which frequencies are determined only by piezoelectric elements. The piezoelectric elements have a specified geometric shape. Each element has three electrodes on one piezoelectric slab arranged to vibrate longitudinally, or has three electrodes with two interposed piezoelectric slabs arranged to vibrate transversely in thickness.

The invention relates to the art of frequency selective amplifier circuits and frequency controlled oscillator circuits and more particularly concerns such circuits wherein frequency selectivity and oscillation frequency are determined only by piezoelectric elements.

Piezoelectric elements as generally used heretofore in oscillator circuits, have been used to stabilize the frequency of operation, while the oscillation frequency itself was determined by lumped or distributed inductance and capacitance elements in the circuit. In such circuits, the physical characteristics of active members such as electron tubes or transistors determined or contributed to the determination of the oscillation frequency. This situation has always proven troublesome because such frequency determining characteristics are rarely known precisely and because these characteristics change erratically with time and usage of the active members.

In prior frequency selective amplifier circuits having at least two stages coupling transformers or other impedance elements at least in part determine the frequencies transmitted and amplified. Such impedance elements are notoriously unstable so frequency selectivity changes erratically. Furthermore they do not have sufficiently high Q to provide the selectivity required. Even where piezoelectric elements are employed in such circuits, they do not primarily determine frequency selectivity which is further affected by the lumped and distributed inductances of the electron tubes or transistors as well as other impedance elements in the circuits.

In the present invention the frequency of oscillation or the frequency selectivity is determined solely by a piezoelectric element of specified structure and geometric shape. The shape of the piezoelectric element determines whether the circuit has one or two discrete predetermined peak operating frequencies, or operates in a predetermined very narrow band of frequencies. Stated another way, when the invention is applied to a transistorized circuit, the physical characteristics of the transistors do not affect, determine or control the frequency of operation. The frequency of operation is also independent of the applied voltage. The invention makes possible oscillator and frequency selective circuits of simplified construction and greater stability as well as predictability of frequency of operation.

It is one object of the invention to provide a frequency selective or oscillator circuit operating at a single peak frequency determined and maintained by a piezoelectric element having equal length and width, with three electrodes applied to one slab or plate to vibrate longitudinally or applied to two slabs or plates to vibrate transversely in thickness.

Another object is to provide a frequency selective amplifier or oscillator circuit operating at two peak frequencies determined and maintained only by a piezoelectric element having greater length than width, with three electrodes applied to one piezoelectric slab or plate to vibrate longitudinally, or applied to two piezoelectric slabs or plates to vibrate transversely in thickness.

A further object is to provide a circuit as last described, wherein the difference between the two peak operating frequencies depends on the difference between length and width of the element and the extent to which the element varies from true squareness or roundness.

Still another object is to provide a frequency selective amplifier circuit operating at a single predetermined peak frequency, the circuit including amplifying transistors coupled by a piezoelectric element, the piezoelectric element determining the frequency selectivity of the circuit, the element having equal length and width with three electrodes on one or two piezoelectric slabs or plates.

A further object is to provide a frequency selective amplifier circuit as last described, wherein the frequency selectivity is increased by a second piezoelectric element having equal length and with two electrodes applied to a single piezoelectric slab or plate, the second piezoelectric element being inserted in the circuit so as to cooperate with the first named piezoelectric element, the two piezoelectric elements having specified relative areas so that the first piezoelectric element vibrates at antiresonance while the second elements resonates at series resonance, both antiresonance and series resonance frequencies being the same.

The invention will be explained in detail in connection with the drawings, wherein.

Figures 1, 2, 3, 4, 5, 6:
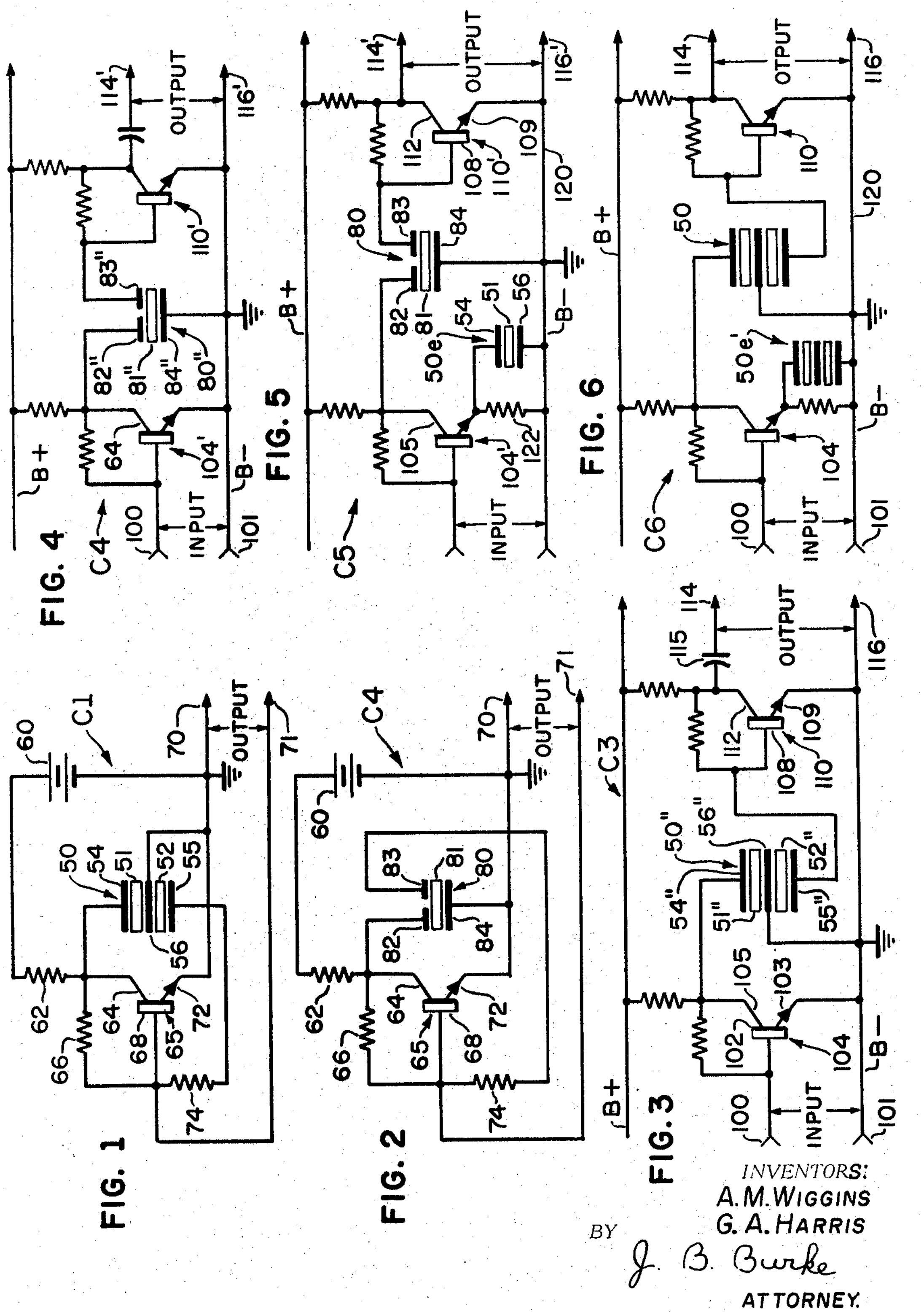
FIGS. 1–6 are diagrams of circuits embodying the invention.

Referring first to FIG. 1 there is shown an oscillator circuit C1 which employs a piezoelectric element 50. This element has two flat slabs or plates 51, 52 made of piezoelectric ceramic material such as barium titanate, piezoelectric crystals such as Rochelle salt, or other suitable piezoelectric material. Outer electrodes 54, 55 are applied to the outer sides of slabs 51, 52 and a center electrode 56 is interposed between the slabs. The electrodes are extremely thin to have a minimum effect on amplitude and frequency of vibration of the element.

In circuit C1, power is supplied by a battery 60 or other direct current source. The positive terminal of the battery is connected via a resistor 62 to electrode 54 of element 50 and to collector 64 of transistor 65. Between collector 64 and base 68 of the transistor is a further resistor 66. The negative terminal of the battery is connected to center electrode 56 of element 50, to circuit output terminal 70, and to emitter 72 of the transistor. The base 68 is connected via resistor 74 to electrode 55 of element 50. Circuit output terminal 71 is connected to base 68.

Figure 7:
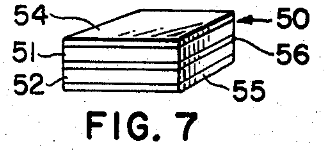
FIGS. 7, 8, 11–17, 19 and 20 are perspective views of piezoelectric elements which may be employed in circuits embodying the invention.
Figure 9:
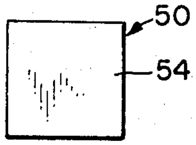
FIGS. 9, 10 and 18 are top plan views of the elements of FIGS. 7, 8 and 17 respectively.

FIGS. 7 and 9 show one possible form for piezoelectric element 50 as used in circuit C1. The element has equal length and width and is square in plan view. The slabs or plates 51, 52 and thin electrodes 54, 55, 56 are correspondingly square.

Figure 8:
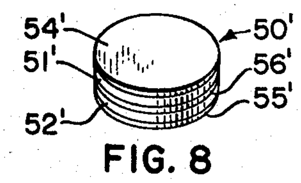
Figure 10:
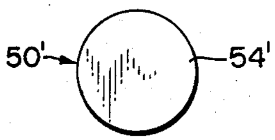

FIGS. 8 and 10 show another form of piezoelectric element having equal length and width for use in circuit C1. Element 50′ is round in plan view. The slabs 51′, 52′ and electrodes 54′, 55′ and 56′ are correspondingly round or circular.

Circuit C1 operates as an oscillator. The element 50 or 50′ is bent transversely perpendicularly to slab 51 due to voltage applied across this slab. A voltage is thus generated piezoelectrically across slab 52 which bends in the direction of its thickness along with slab 51. The voltage generated across slab 52 is fed to the base of the transistor through resistor 74 and to the emitter 72. An oscillating voltage appears at output terminals 70, 71 since the voltage applied to the base is also fed back to the collector via resistor 66. The element 50 vibrates in the direction of its thickness. The frequency of vibration or oscillation is determined by the mass, linear dimensions, and other physical characteristics of element 50 or 50′. The frequency is independent of the applied voltage and of the electrical characteristics of the transistor amplifier. Circuit C1 is thus an oscillator whose frequency of operation is only dependent on the characteristics of the piezoelectric element which both determines and controls its frequency.

FIG. 2 shows an oscillator circuit C2 which is generally similar to circuit C1 and corresponding parts are identically numbered. The circuit has piezoelectric element 80 formed with a single piezoelectric slab or plate 81. On one side of the slab are two electrodes 82, 83. A single electrode 94 is applied to the other side of the slab. Electrode 82 is connected to the junction of collector 84 and resistors 62 and 66. Electrode 83 is connected via resistor 74 to base 68. Electrode 84, emitter 72 and output terminal 70 are connected together.

Figures 11, 12, 15:
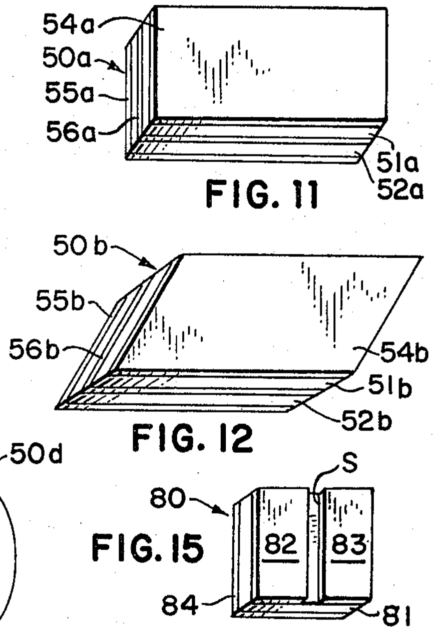

In circuit C2, the piezoelectric element has equal length and width. It may be square as shown in FIG. 15. Slab 81 and electrode 84 are both square and of equal size. Electrodes 82 and 83 are rectangular with each slightly less than half the size of slab 81 to leave a small space S between the electrodes. Element 80 vibrates longitudinally in its plane rather than in a thickness bending mode as do elements 50 and 50′. The circuit C2 oscillates at a single frequency determined only by the physical characteristics of element 80. The frequency is independent of the applied voltage and of the transistor characteristics.

Figure 16:
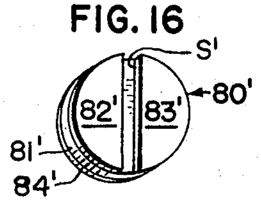

FIG. 16 shows an alternate form of piezoelectric element which can be employed in place of square element 80 in circuit C2. Element 80′ also has equal length and width and is round, with a round or circular slab 81′ and similar circular electrode 84′ of the same size. Electrodes 82′ and 83′ on the other side of slab 81′ are substantially semicircular with small space or gap S′ therebetween.

Figure 13:
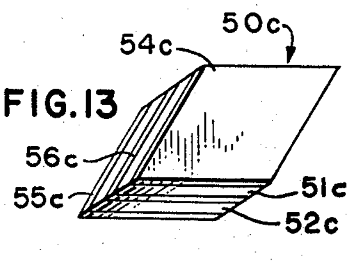
Figure 14:
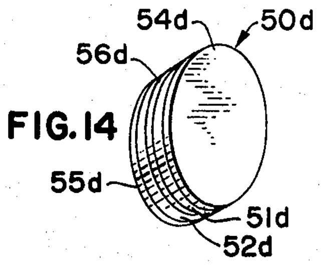

It is possible to employ circuits C1 and C2 to produce two different oscillating frequencies at the output terminals. This is done by making the piezoelectric element in a shape other than round or square, i.e., of unequal length and width. For example, element **50*a* shown in FIG. 11 is rectangular. Piezoelectric slabs 51*a* and 52*a* and electrodes 54*a*, 55*a* and 56*a* are all rectangular and of equal size. As further examples, piezoelectric element 50*b* shown in FIG. 12 is parallelogrammic; element 50*c* in FIG. 13 is rhomboid; and element 50*d*** in FIG. 14 is elliptical. Other symmetrical shapes of unequal length and width are possible. In each element, there will be two flat slabs of piezoelectric material interposed between three electrodes. Any one of these elements of unequal length and width can be used in circuit C1 to produce two output frequencies.

Figure 17:
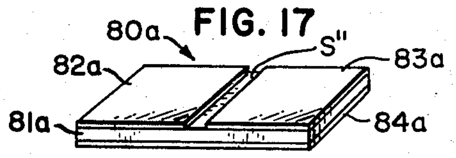
Figure 18:
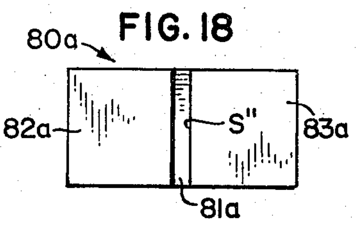
Figure 19:
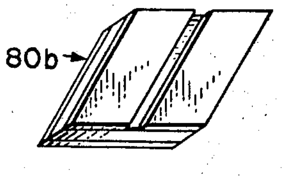
Figure 20:
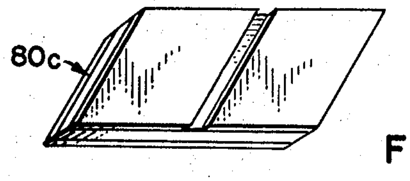
Figure 21:
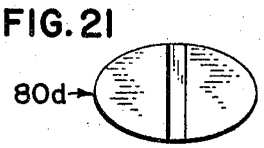
FIG. 21 is a top plan view of another piezoelectric element.
Figure 22:
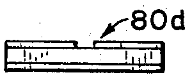
FIG. 22 is a side elevational view of the element of FIG. 21.

FIGS. 17 and 18 show a rectangular piezoelectric element **80*a* which can be used in place of element 80 in circuit C2 to produce two output frequencies. Upper electrodes 82*a* and 83*a* may be rectangular or square, and spaced apart by a gap S″ transversely across the element. The single piezoelectric slab 81*a* and single electrode 84*a* are rectangular. FIG. 19 shows a rhomboid element 80*b*. FIG. 20 shows a parallelogrammic piezoelectric element 80*c*. FIGS. 21 and 22 show an elliptical element 80*d***. Other shapes of unequal length and width are possible. In each such element there will be a single slab or plate of piezoelectric material with one full size electrode on one side extending the full length and width of the slab, and with two electrodes on the other side each having the full width but about one half the length of the piezoelectric slab.

The piezoelectric elements described can be used in frequency selective circuits to pass either one or two selected peak frequencies. As an example, FIG. 3 shows a circuit C3 employing a piezoelectric element 50″ with two piezoelectric slabs 51″, 52″ interposed between three electrodes 54″, 55″, 56″. The signal input terminals 100 are connected between base 102 and emitter 103 of transistor 104. Emitter 103 and collector 105 are connected to electrodes 56″ and 54″ respectively. The signal output is taken off electrodes 55″, 56″ and applied between base 108 and emitter 109 of transistor 110. The amplified signal is obtained at output terminals 114, 116 from collector 112 via capacitor 115 and from emitter 109.

If element 50″ has equal length and width, i.e., is square or round as shown in FIGS. 9 and 10 respectively, then a single peak frequency will be transmitted between input and output terminals of the circuit. If element 50″ is other than square or round as shown in any of FIGS. 11–14, then the circuit will pass two peak frequencies.

Instead of an element having two piezoelectric slabs or plates like element 50″, an element 80″ having a single piezoelectric slab or plate 81″ and three electrodes 82″, 83″, and 84″ can be employed as shown in circuit C4 of FIG. 4. Components of circuit C4 corresponding to those of circuit C3 are identically numbered. The collector 105 of transistor 104 is connected to electrode 82″. Electrode 83″ is connected to base 108 of transistor 110. Electrode 84″ is connected to emitter 109. The output response derived at terminals 114′, 116′ will be a single peak frequency if a square or round piezoelectric element is employed as shown in FIGS. 15 and 16. If an element other than square is employed as shown in FIGS. 17–22, the output response will have two peak frequencies.

Figure 23:
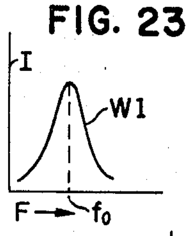
FIGS. 23–27 are graphic diagrams used in explaining the invention.
Figure 24:
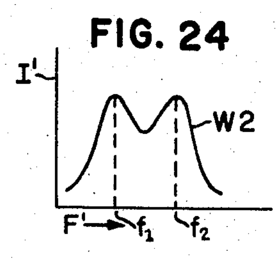
Figure 25:
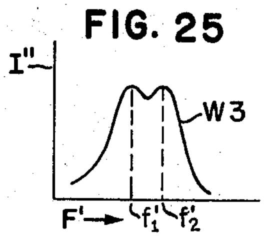

FIG. 23 shows a frequency-response curve W1 illustrating the single peak frequency $f_0$ produced by a piezoelectric element of equal length and width such as the square or round elements 50, 50′ and 80, 80′ of FIGS. 9, 10, 15 and 16. Response I is plotted against frequency F. FIG. 24 shows frequency-response curve W2 illustrating two spaced peak frequencies $f_1$ and $f_2$ obtained when the piezoelectric element is other than square or round, i.e., has unequal length and width as shown in FIGS. 11–14 and 17–22 by elements **50*a*–50*d* and 80*a*–80*d***. Frequency F′ is plotted against response I′. By changing the configuration of the elements which have greater length than width so that they are more square or circular, the effect shown in FIG. 25 can be obtained. The two peak quencies $f_1'$ and $f_2'$ of frequency-response curve W3 are brought closer together than peak frequencies $f_1$ and $f_2$ of curve W2. By bringing the two peaks closer together the response has a substantially flattened top. Response I″ is plotted against frequency I′. Thus by making a rectangular or parallelogrammic element more equilateral the separation of frequency of response peaks can be narrowed and overall response can be broadened. The same can be accomplished in a rhomboid element by making the sides more perpendicular to each other. The same is also accomplished in an elliptical element by making it more round or circular. Thus circuits C3 and C4 can pass a single peak frequency as shown by curve W1. They can pass signals with two separate peak response frequencies as shown by curve W2; or they can pass a broad band of frequencies as shown by curve W3, depending on relative length and width of the piezoelectric element.

Circuit C5 in FIG. 5 shows a way for increasing frequency selectivity of an amplifier circuit over that of circuit C4. Parts corresponding to those of circuit C4 are identically numbered. If a square piezoelectric element 80 with a single piezoelectric slab or plate such as shown in FIG. 15 is employed, this element vibrates in its plane or longitudinally in a direction perpendicular to the spaced edges of electrodes 82, 83. Electrode 82 is connected to collector 105 of transistor 104'. Electrode 83 is connected to base 108 of transistor 110'. Between emitter 103 and the grounded B− power line 120 is a square piezoelectric element 50*e* provided with one piezoelectric slab or plate 51 and two electrodes 54, 56. A resistor 122 is connected across element 50*e*. For a given selected frequency, this circuit will have a sharper peak frequency response than is obtainable with circuit C4, even if element 80'' shown there is made square. The reason this is so may be best understod by reference to FIGS. 26 and 27.

Figure 26:
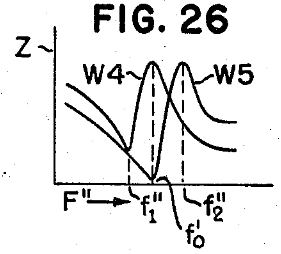
Figure 27:
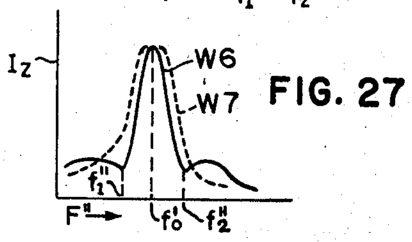

In FIG. 26, frequency-impedance characteristic curves W4 and W5 of piezoelectric elements 80 and 50*e* respectively are shown. Frequency F'' is plotted against impedance Z. At a predetermined frequency $f_0'$ element 80 is at antiresonance or parallel resonance while element 50*e* is at series resonance, so that their equivalent impedances are maximum and minimum respectively. At some frequency $f_1''$ slightly below frequency $f_0'$ element 80 is at series resonance. At some frequency $f_2''$ just above frequency $f_0'$ element 50*e* is at antiresonance. These characteristics in circuit C5 result in the frequency-response curve W6 shown in FIG. 27. The dotted line response curve W7 is the characteristic of circuit C4 shown in FIG. 4, but without element 50*e* and with a square piezoelectric element in the circuit. It will be noted that the peak response at frequency $f_0'$ is rendered much sharper in circuit C5 as shown by curve W6. The response at frequencies $f_1''$ and $f_2''$ are reduced due to operation of element 50*e* in the circuit.

This desirable result is obtained by constructing element 80 so that it has antiresonance at the desired peak frequency $f_0'$ and by constructing element 50*e* so that it has series resonance at the same frequency. We have discovered a simple and effective way of obtaining these effects. By making the area of element 50*e* just about 85% of the area of element 80, i.e., by making the width of element 50*e* 0.93 times the width of element 80, and of the same thickness, these two elements will have resonance and antiresonance respectively coincident at the same frequency. The same dimensional relationship can be employed using circular piezoelectric elements for both elements 80 and 50*e* instead of square ones.

It is also possible to obtain increased selectivity over that of circuit C3 by the circuit arrangement C6 of FIG. 6. Piezoelectric element 50 is square. It has two piezoelectric slabs and vibrates transversely in the direction of its thickness as explained in connection with FIGS. 1 and 7. Square elements 50*e'* also has two square piezoelectric slabs like element 50, and vibrates transversely in the direction of its thickness; but element 50*e'* has an area approximately 85% of that of element 50. The solid line curve W6 of FIG. 27 with sharply peaked center frequency $f_0'$ will be obtained again as contrasted with the broader peak response of circuit C3 shown by the dotted curve W7. If desired, circular piezoelectric elements can be used in circuit C6 instead of square elements 50 and 50*e'*. Response $I_z$ is plotted against frequency F'' in FIG. 27.

The invention thus makes it possible to employ piezoelectric elements to perform all the functions of frequency determination normally heretofore performed by inductive and capacitive elements in oscillators and frequency selective wave transmission circuits.

What is claimed is:

1. A frequency selective circuit, comprising:

(a) a piezoelectric element, said element having a vibratory body with first, second and third spaced electrodes thereon, said body having unequal length and width, so that the piezoelectric element has two antiresonance frequencies;

(b) a transistor havng a base, emitter and collector;

(c) a direct current power supply having positive and negative terminals;

(d) first and second resistors;

(e) means electrically connecting said positive terminal to the collector and first electrode via the first resistor;

(f) means electrically connecting said negative terminal directly to the emitter and second electrode;

(g) means electrically connecting said collector and first electrode to the base via the second resistor; and (h) circuit means for applying an oscillatory signal between said emitter and base, whereby a first oscillatory voltage will appear between the second and third electrodes of said element at a frequency which is the same as one of said two antiresonance frequencies, and whereby a second oscillatory voltage will appear between the second and third electrodes at another frequency which is the same as the other antiresonance frequency.

2. A frequency selective circuit as defined in claim 1, wherein said vibratory body comprises two flat piezoelectric slabs of substantially equal size respectively disposed between the first and second electrodes and between the second and third electrodes, so that the piezoelectric element vibrates in the direction of its thickness, whereby when an oscillatory voltage is applied to one slab between the first and second electrodes voltage pulses are piezoelectrically generated across the other slab between the second and third electrodes.

3. An oscillatory circuit, comprising:

(a) a piezoelectric element, said element having a vibratory body with first, second and third spaced electrodes thereon, said body having unequal length and width, so that the piezoelectric element has two antiresonance frequencies;

(b) a transistor having a base, emitter and collector;

(c) a direct current power supply having positive and negative terminals;

(d) first and second resistors;

(e) means electrically connecting said positive terminal to the collector and first electrode via the first resistor;

(f) means electrically connecting said negative terminal directly to the emitter and second electrode;

(g) means electrically connecting said collector and first electrode to the base via the second resistor;

(h) a third resistor; and (i) means connecting the base to the third electrode via the third resistor, whereby a first oscillatory voltage is generated between the second electrode and base at a frequency which is the same as one of the antiresonant frequencies, and whereby a second oscillatory voltage is generated between the second electrode and base at a frequency which is the same as the other antiresonance frequency.

4. An oscillatory circuit as recited in claim 3, wherein said vibratory body is a flat piezoelectric slab, wherein said first and third electrodes are applied to one side of said slab, and wherein said second electrode is applied to the other side of the slab, so that the slab vibrates longitudinally in its plane, whereby voltage pulses applied to the slab between the first and second electrodes deform the slab so that voltage pulses are generated piezoelectrically between the second and third electrodes.

5. An oscillatory circuit as recited in claim 3, wherein said vibratory body has two flat piezoelectric slabs of substantially equal size respectively disposed between the first and second electrodes and between the second and third electrodes, so that the piezoelectric element vibrates transversely in the direction of its thickness, whereby voltages applied to one slab between the first and second electrodes deform the piezoelectric element so that voltage pulses are piezoelectrically generated across the other slab between the second and third electrodes.

6. A frequency selective circuit, comprising:
(a) A first piezoelectric element, said element having a vibratory body of equal length and width, so that the element has a single antiresonance frequency, said body having first, second and third spaced electrodes thereon;
(b) a transistor having a base, emitter and collector;
(c) a direct current power supply having positive and negative terminals;
(d) first and second resistors;
(e) means electrically connecting said positive terminal to the collector and first electrode via the first resistor;
(f) means electrically connecting said negative terminal directly to the emitter and second electrode;
(g) means electrically connecting said collector and first electrode to the base via the second resistor;
(h) means for applying an oscillatory input signal between said emitter and base, whereby an oscillatory voltage will appear between the second and third electrodes of said element at a frequency which is the same as said antiresonance frequency,
(1) said first and third electrodes being applied to one side of said body, and
(2) said second electrode being applied to the other side of said body, so that the piezoelectric element vibrates longitudinally in its plane, whereby voltage pulses applied to said body between the first and second electrodes reform the body so that voltage pulses are piezoelectrically generated between the second and third electrodes; and
(i) a second piezoelectric element having a series resonance frequency which is the same as the antiresonance frequency of the first piezoelectric element, said second element being connected between said emitter and said second electrode to cooperate with the first element in preventing appearance of oscillatory voltage between the second and third electrodes of the first element at all frequencies other than the antiresonance frequency of the first element.

7. A frequency selective circuit as defined in claim 6, wherein the area in plan view of the second element is approximately 85% of the area in plan view of the first named element.

8. An oscillator circuit, comprising:
(a) a piezoelectric element, said element being a flat, square body comprising:
(1) first and second flat, square, piezoelectric slabs of equal square size;

(2) a first flat, square electrode interposed between the two slabs with opposite sides of the electrode in contact with the entire areas of inner sides of the slabs;
(3) a second flat, square electrode juxtaposed to and in contact with the entire area of the outer side of the first slab; and
(4) a third flat, square electrode juxtaposed to and in contact with the entire area of the outer side of the second slab;
(5) the square areas of all the electrodes being equal to the areas of the square sides of the slabs contacted by the electrodes so that edges of all electrodes register with adjacent edges of the slabs;
(6) the electrodes and slabs constituting an integral, unitary body that said body vibrates only in a bending mode at a single resonant frequency while all vibrations in extensional modes parallel to planes of the flat slabs are effectively suppressed;
(b) a transistor having a base, emitter and collector;
(c) a direct current power supply having positive and negative terminals;
(d) first and second resistors;
(e) means electrically connecting said positive terminal to the collector and second electrode via the first resistor;
(f) means electrically connecting said negative terminal directly to the emitter and first electrode;
(g) means electrically connecting said collector and second electrode to the base via the second resistor;
(h) a third resistor; and
(i) means connecting the base to the third electrode via the third resistor, whereby an oscillatory voltage is generated between the first electrode and base at said single resonant frequency.

References Cited

UNITED STATES PATENTS

| | | | |
|---|---|---|---|
| 3,061,792 | 10/1962 | Ebbinge | 330—21 |
| 3,150,328 | 9/1964 | Schrecongost | 331—117 X |
| 3,209,273 | 9/1965 | Wood | 330—174 X |
| 3,297,968 | 1/1967 | Fowler | 333—72 |
| 3,299,301 | 1/1967 | Heilmann et al. | 310—9.8 |

FOREIGN PATENTS

| | | |
|---|---|---|
| 866,804 | 2/1953 | Germany. |

JOHN KOMINSKI, *Primary Examiner.*

S. H. GRIMM, *Assistant Examiner.*

U.S. Cl. X.R.

310—9.6, 9.8; 330—21, 31, 174; 331—163; 333—72